United States Patent
Hendrich (10) Patent No.: US 8,153,967 B2
(45) Date of Patent: Apr. 10, 2012

(54) METHOD OF GENERATING PARTICLE BEAM IMAGES USING A PARTICLE BEAM APPARATUS

(75) Inventor: Christian Hendrich, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 284 days.

(21) Appl. No.: 12/542,213

(22) Filed: Aug. 17, 2009

(65) Prior Publication Data
US 2010/0038534 A1    Feb. 18, 2010

(30) Foreign Application Priority Data
Aug. 18, 2008    (DE) .................. 10 2008 038 216

(51) Int. Cl.
*G01N 23/00* (2006.01)
(52) U.S. Cl. ............ 250/307; 250/281; 250/282
(58) Field of Classification Search .......... 250/307
See application file for complete search history.

(56) References Cited

U.S. PATENT DOCUMENTS

| | | | |
|---|---|---|---|
| 5,438,197 A | 8/1995 | Fujii et al. | |
| 6,437,330 B1 | 8/2002 | Sugiyama | |
| 6,838,667 B2 * | 1/2005 | Tsuneta et al. | 850/10 |
| 7,038,197 B2 * | 5/2006 | Bateman et al. | 250/281 |
| 7,154,090 B2 | 12/2006 | Kawada et al. | |
| 7,559,047 B2 * | 7/2009 | Miyamoto et al. | 716/50 |
| 2006/0278826 A1 | 12/2006 | Roberts et al. | |
| 2007/0064100 A1 * | 3/2007 | Kobaru et al. | 348/79 |

FOREIGN PATENT DOCUMENTS

| | | |
|---|---|---|
| DE | 19915767 | 3/2000 |
| JP | 55086059 | 6/1980 |
| JP | 03046743 | 2/1991 |
| JP | 05290783 | 11/1993 |
| JP | 2008047393 | 2/2008 |

OTHER PUBLICATIONS

Software-Modul AxioVision 4.7; Publication Jul. 2, 2008 "High Dynamic Range Imaging Software from Zeiss"; http//www.microscopy-analysis.com/item/902.

* cited by examiner

*Primary Examiner* — Phillip A Johnston
(74) *Attorney, Agent, or Firm* — Fish & Richardson P.C.

(57) ABSTRACT

A representation of a particle beam image is generated by acquiring plural data sets using a particle beam apparatus. Each data set represents secondary particle intensities from a region of an object. The secondary particle intensities are acquired for the different data sets with different parameter adjustments of the particle beam apparatus. From the plural acquired data sets image data are generated using a tone-mapping method. The image data are represented at an output medium.

20 Claims, 3 Drawing Sheets

METHOD OF GENERATING PARTICLE BEAM IMAGES USING A PARTICLE BEAM APPARATUS

CROSS-REFERENCE TO RELATED APPLICATION

This applications claims priority under 35 U.S.C. §119 to German Patent Application DE 10 2008 038 216.7, filed Aug. 18, 2009. The contents of this application is hereby incorporated by reference in its entirety.

FIELD

The disclosure relates to methods of generating particle beam images using a particle beam apparatus, such as an electron microscope.

BACKGROUND

An example for a conventional particle beam apparatus is a scanning electron microscope (SEM). Such apparatus is used to scan a finely focussed probe forming primary electron beam across a region of an object. The primary electrons impinging on the object result in secondary electrons which are detected by a detector. A signal generated by the detector represents an intensity of generated secondary electrons and is recorded in dependence of a location of the object to which the primary beam is directed. The recorded signals form a data set representing image information of an electron microscopic image of the object. This image information is then displayed on a display medium, such as a monitor, for observation by a user. The user may gather features of the object from the displayed image and may take a decision on how to further process the object based on the displayed image.

It has been found that the representation of particle beam images is sometimes insufficient. In particular, some users have perceived a deficiency of contrast of the representation. Sometimes, features of the object which should be visible in dark regions of the represented image or which should be visible in bright regions of the represented image are not recognized.

SUMMARY

The disclosure provides improved methods of generating representations of particle beam images.

In some embodiments, particle intensities are detected in a dynamic range which is greater than a dynamic range which can be used by a display medium employed for representation of the particle beam image.

In certain embodiments, a tone-mapping method is employed to convert detected particle intensities into brightness values of the represented particle beam image.

In some embodiments, two or more data sets of intensity signals are consecutively acquired from a same region of the object. The intensity signals represent detected particle intensities from that region. At least one parameter setting of the particle beam apparatus is changed between the acquiring of the respective data sets.

In certain embodiments, the at least one parameter setting of the particle beam apparatus may include one or more of a setting of an overall amplification of a particle detection system of the particle beam apparatus, a setting of an amplification of an electrical analogue amplifier of the particle beam apparatus, a setting of a gain of an electrical analogue-to-digital converter of the particle beam apparatus, a setting of an amplification of a photo multiplier of the particle beam apparatus, a setting of an acceleration voltage applied at dynodes of a photo multiplier of the particle beam apparatus, a setting of a beam current of the primary beam of the particle beam apparatus, a setting of a scan velocity during the scanning of the region of the object, a setting of an exposure time of a scanning particle beam at locations of the object, and a setting of a beam energy of the particle beam.

In the context of the present disclosure, the term overall amplification of the particle detection system denotes a ratio between an intensity of a detection signal generated by the particle detection system and a number of particles which are generated at the object. This overall amplification may be increased or decreased by changing, for example, the amplification of the electrical analogue amplifier. This overall amplification may be also increased or decreased by changing, for example, an acceptance or efficiency of the particle detection system. This may also include a selection of a particle detection system from plural different particle detection systems which are different regarding their efficiency. This may further include changing of electrical fields which cause an extraction of particles from the object, such that the acceptance of the particle detection system is changed.

In some embodiments, the at least one parameter setting is significantly changed between the acquiring of the data sets such that also detected particle intensities at locations of the imaged regions corresponding to each other differ significantly. For example, the at least one parameter setting can be changed to such an extend that the detected particle intensities at locations of the region corresponding to each other differ by more than 5 times, such as by more than 20 times. The detected particle intensities at locations of the region corresponding to each other may also differ by one or more orders of magnitude, for example by more than 100 times (e.g., more than 500 times, more than 2,000 times or more than 10,000 times).

In certain embodiments, the overall amplification of the particle detection system is significantly changed between the acquiring of data sets. The significant change may include a change by a factor of more than 5 (e.g., more than 20, more than 100, more than 500, more than 2,000 or more than 10,000).

In some embodiments, the beam current of the particle beam and/or the beam energy of the particle beam is not significantly changed or kept constant between the acquiring of data sets. A change which is not significant may include a change by a factor of less than 2 (e.g., less than 1.2 or less than 1.02). Herein, the beam current of the particle beam relates to the amount of charged particles impinging onto the object per unit time.

In some embodiments, the data sets for the region of the object are acquired by scanning a finely focussed probe forming particle beam across the region of the object, and by recording detected particle intensities corresponding to individual impingement locations of the primary beam onto the object. Exemplary embodiments of such particle beam apparatus include a scanning electrode microscope (SEM), a scanning transmission electron microscope (STEM), a scanning ion microscope and a scanning transmission ion microscope.

In certain embodiments, the data sets are acquired by illuminating the region of the object with an extended primary beam and by imaging the region onto a position sensitive detector using suitable particle optics of the particle beam apparatus, and recording detection signals of the position sensitive detector. Exemplary embodiments of such particle beam apparatus include an electron microscope of a type LEEM, a transmission electron microscope (TEM) and a transmission ion microscope.

BRIEF DESCRIPTION OF THE DRAWINGS

The foregoing as well as other advantageous features will be more apparent from the following detailed, the claims, and the drawings, which:

DETAILED DESCRIPTION

Figure 1:
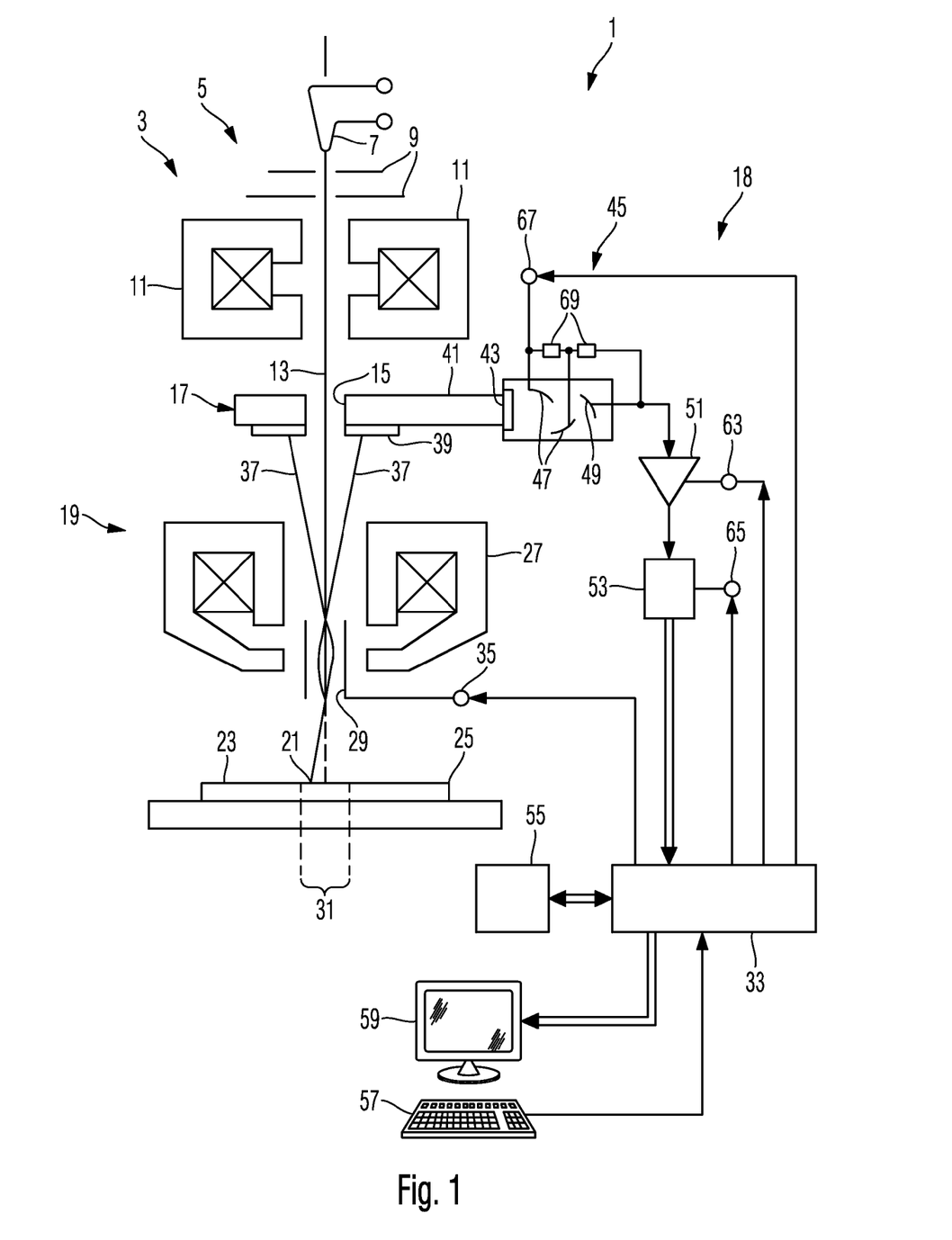
FIG. 1 is a schematic representation of a particle beam apparatus.

FIG. 1 is a schematic illustration of a particle beam system 1. The particle beam system includes a particle beam apparatus 3. In the illustrated example, the particle beam apparatus is an electron microscope of a SEM type. However, the particle beam apparatus is not limited to electron microscopes of the SEM type. Some embodiments may include electron microscopes of the LEEM type or TEM type. Certain embodiments may include particle beam apparatuses that use ions as primary particles and/or which detect ions as secondary particles.

The electron microscopy system 3 includes an electron beam source 5 having a cathode 7, extractor and suppressor electrodes 9 and a condenser lens 11, to generate a primary electron beam 13. The primary electron beam 13 traverses an opening 15 in a detector 17 of a secondary electron detection system 18 and is directed by electron optics 19 to a location 21 on a surface 23 of an object 25. The electron optics 19 includes in the exemplary illustration of FIG. 1 a magnetic objective lens 27 and may include other magnetic or electrostatic lenses and electrodes which are not shown in FIG. 1. The optics 19 further includes deflectors 29 to adjustably deflect the primary electron beam 13 from its straight direction of propagation so that the primary electron beam 13 may be directed towards selectable locations 21 within an extended region 31 on the surface 23 of the object 25. Moreover, a controller 33 of the electron microscopy system 1 may apply control voltages or control currents to the beam deflector 29 via an interface 35 to scan the primary electron beam 13 according to a predetermined scan pattern, for example line-by-line, across the extended region 31.

The electrons of the primary electron beam 13 release, at the location 21 at which the primary electron beam 13 impinges onto the object 25, secondary electrons which are accelerated away from the surface 23 of the object 25 by an electrode (not shown in FIG. 1) and which enter the objective lens 27. Exemplary trajectories of such secondary electrons are denoted in FIG. 1 with reference numeral 37. A portion of the secondary electrons impinges on a layer 39 of scintillator material and generates one or more photons which enter into a light guide 41 of the detector 17 and which are guided therein to a photo cathode 43 of a photo multiplier 45. The photons generate electrons which are multiplied via a cascade of dynodes 47 and impinge on an anode 49 of the photo multiplier 45. The electrons impinging on the anode 49 generate a current which is amplified by an electrical analogue amplifier 51 and which is converted to a digital signal by an analogue-to-digital converter 53. The digital signal represents an intensity of secondary electrons which are generated by the primary electron beam 13 at the location 21. The signal provided by the analogue-to-digital converter 53 is read out and received by the controller 33.

In the illustrated embodiment, the detector 17 of the particle detection system 18 is arranged such that particles which are detected have to traverse the objective lens 27. However, it is also possible that the particle detection system 18 includes alternatively or in addition to the detector 17 one or more other detectors which are also suitable to detect secondary electrons. For example, such other detector may be arranged adjacent to the objective lens 27 close to the surface 23 of the object 25.

The controller 33 is configured to acquire a data set of intensity signals associated with the region 31 of the surface 21 of the object 25. For this purpose, the controller 33 directs the primary electron beam, by controlling the interface 35, to different locations 21 in the region 31 according to a predefined pattern which may include, for example, a line-by-line pattern and a column-by-column pattern. The intensity signals received from the analogue-to-digital converter 53 are stored in dependence of the respective locations 21 as a data set in a storage medium 55 of the electron microscopy system 1. The storage medium can be integrated into the controller 33, it can be located separate from the controller and may include, for example, a semiconductor storage, hard-disc storage, a network storage and others.

One or more input devices 57, such as a keyboard or a mouse, and one or more output media, such as a monitor 59 or a printer are connected to the controller 33. Using the input device 57, a user may request the controller 33 to load a data set associated with the region 31 from the storage 55 and to convert it into brightness values for a image representation on the output medium 59. For this purpose, pixels or image elements of the output medium 59 can be associated with one or more locations 21 of the region 31. Brightness values are computed for the pixels from intensity signals of the data set corresponding to the locations 21 associated with the respective pixels. The pixels are set to the computed brightness values. The entirety of set pixels of the output medium 29 represents an electron microscopic image of the region 31 of the object 25. The representation can be a positive representation such that locations at which a higher secondary electron intensity was detected are represented brighter, while locations, at which a lower secondary electron intensity was detected are represented darker. Alternatively, the representation can be a negative representation such that locations at which a higher secondary electron intensity was detected are represented darker, while locations, at which a lower secondary electron intensity was detected are represented brighter.

A quality of a represented image obtained as illustrated above is restricted by a dynamic range of the secondary particle detection system 18 and by a dynamic range of the display medium 59. It is, however, possible to use the particle beam system 1 to record and/or represent particle beam images having an improved quality, such as an increased dynamic range, as illustrated below.

For this purpose, the controller 33 is configured to consecutively acquire two or more data sets from the region 31, wherein one or more parameter settings of the electron microscope 3 are changed between the acquiring of a data set and the acquiring a subsequent data set. The consecutively acquired data sets are each stored in the storage medium 55. The change of the parameter settings results in a significant difference between the secondary electron intensities recorded during acquisition of one of the data sets at the locations 21 of the region 31 and the secondary electron intensities recorded at the corresponding locations 21 of the region 31 during acquisition of the other one of the data sets.

The relative difference of the respective secondary particle intensities may for example be greater than 5, greater than 10 or greater than 100. The relative difference may also amount to several orders of magnitude, for example more than 100, 500, 2,000 or 10,000. Two data sets acquired in this way thus represent electron microscopic images which differ with respect to their exposure and/or their dynamic range. For example, in the image represented by one of the data sets, some first regions may be underexposed, and some other second regions may be normally exposed, while in the image represented by the other one of the data sets the first regions may be normally exposed and the other second regions may be overexposed. By the acquisition of the two or more data sets associated with the region 31, the acquired imaged information for the region 31 is increased compared to a situation in which merely one data set is acquired for the region 31. The increased image information may be employed to generate a representation of the image with higher quality.

The following exemplary parameters can be taken into consideration as the parameters which are changed between the acquisition of consecutive data sets: a setting of an amplification of the amplifier 51 which is adjustable by the controller 33 via an interface 63, a setting of a gain of the analogue-to-digital converter 53 which is adjustable by the controller 33 via an interface 65, and a setting of an amplification of the photo-multiplier 45 which is adjustable by the controller 33 via an interface 67, wherein the interface 67 can be used to change voltages which are applied to the dynodes 57 and the anode 49 of the photo multiplier 45 via a resistor network 69. A setting of a beam current of the primary electron beam 13 can be used as a further exemplary parameter. The beam current is adjustable by changing a heating voltage supplied to the cathode 7 or by changing voltages applied to the electrode 9. A setting of a beam energy of the primary electron beam 13 can be used as a further exemplary parameter. The beam energy can be changed by changing a voltage between the cathode 7 and the object 25. A setting of a scan velocity at which the primary electron beam scans across the surface of the object can be used as a further exemplary parameter.

The acquired data sets which contain intensity signals representing secondary electron intensities can be converted into brightness values for the image representation by using a tone-mapping method. This includes applying local filters to the image data where a brightness is increased in regions of the image which are relatively dark as compared to other regions of the image, while a brightness is reduced in other regions of the image which are relatively bright. This may in particular result in that for plural triples of locations in the predetermined region the following conditions are satisfied: an average is associated with each of the locations, wherein the average is calculated based on the intensity signal corresponding to the location in the first data set and on the intensity signal corresponding to this location in the second data set; a first location of the triple is spaced apart from a second location of the triple by a first distance; a third location of the triple is spaced apart from the first location of the triple by a second distance, the second distance being at least three times greater than the first distance; the average associated with the first location is greater than the average associated with the second location; the average associated with the first location is greater than the average associated with the third location; the first location is represented in the image representation with a greater intensity than the second location; and the first location is represented in the image representation with a smaller intensity than the third location.

A first pixel representing a greater intensity than a second pixel can be represented brighter than the second pixel if the representation is a positive representation, or the first pixel can be represented darker than the second pixel if the representation is a negative representation.

Using the illustrated tone-mapping method it is possible that structures having low intensity differences at a low intensity level are represented in the represented image at a higher intensity level with greater intensity differences such that these structures are more clearly perceivable in the representation of the image. Similarly, structures having low intensity differences at a high intensity level can be represented in the image representation at a lower intensity level and with greater intensity differences. This may result in a better perceptibility of structures which are represented by image data having a greater dynamic range than the dynamic range of the medium which is provided for the image representation.

According to some embodiments, the multiple acquisition of data sets of the same region at different parameter settings of the particle beam apparatus is performed without employing the tone-mapping method. According to other embodiments, the tone-mapping method can be applied to only one data set acquired at a single parameter setting of the particle beam apparatus. According to still further embodiments the acquiring of plural data sets at different parameter settings of the particle beam apparatus can be performed together with the tone-mapping method for the image representation.

Figure 2:
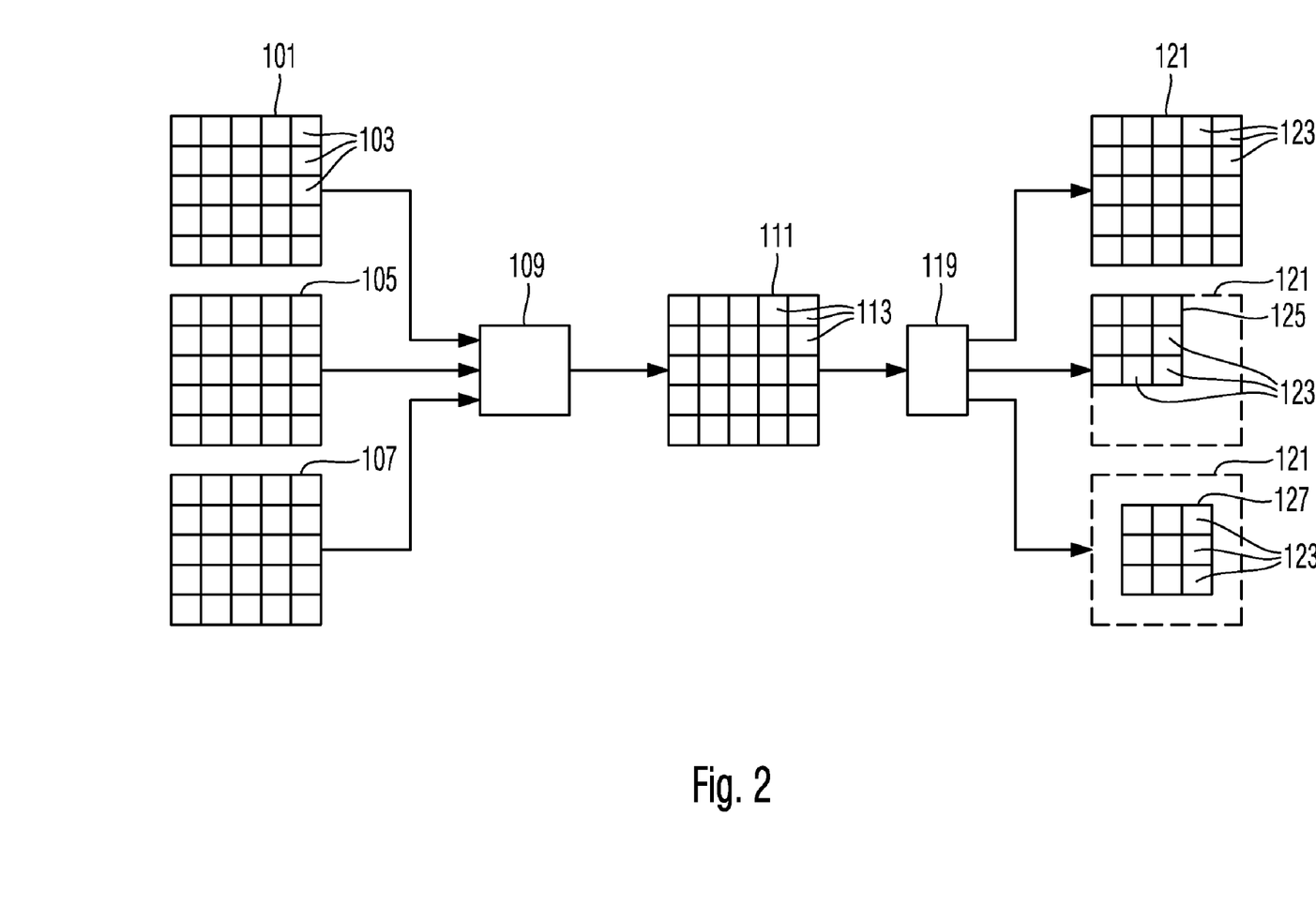
FIG. 2 is a schematic illustration of processed data sets.

FIG. 2 is a schematic illustration of a data processing. A rectangle 101 in FIG. 2 represents a first data set which was acquired at a first parameter setting of the particle beam system shown in FIG. 1. The data set includes 25 data entries 103. Each data entry represents an intensity signal which in turn represents a particle intensity at a particular location 21 of the region 31. In the illustration of FIG. 2, the data entries 103 are arranged in a two dimensional array such that entries adjacent to each other in the array correspond to locations 21 in the region 31 adjacent to each other for which locations the particle intensities were acquired. The low number of 5×5 data entries 103 was chosen merely for the purposes of illustration. In reality, the number of the data entries 103 per data set is considerably higher and can be, for example, 1000× 1000.

The data entries 103 may represent comparatively large and comparatively small particle intensities. A dynamic range of the particle intensities represented by the data set 101 is limited, for example, by a noise and a saturation current of the photo multiplier 45, by a resolution, a saturation and/or a noise of the amplifier 51, an accuracy, a gain, a saturation and/or a number of bits of the analogue-to-digital converter 53.

A rectangle 105 in FIG. 2 represents a second data set which was acquired using the particle beam system 1. Also, a rectangle 107 in FIG. 2 represents a third data set which was also acquired using the particle beam system 1. The three data sets 101, 105, and 107 have in common that their data entries 103 each represent particle intensities for same locations 21 of the same region 31 corresponding to each other. The three data sets 101, 105, and 107 differ in that the particle intensities represented by the data entries 103 were acquired at different settings of parameters of the particle beam system 1. In particular, data entries 103 of the data sets 101, 105, and 107 corresponding to each other represent different particle intensities at correspondingly same locations 21. Although the particle intensities represented by the data entries 103 in each of the data sets 101, 105, and 107 are restricted with respect to their dynamic range, the three data sets 101, 105, and 107 together contain information about particle intensities in a comparatively increased dynamic range.

A software or hardware module 109 which may be integrated in the controller 33 uses the data sets 101, 105, and 107 to compute a new data set 111. The data set 111 has a number of data entries 113, wherein the number corresponds to the number of data entries 103 of the data sets 101, 105, and 107, respectively. The data entries 113 of the data set 111 are computed by the module 109 from corresponding data entries 103 of the data sets 101, 105, and 107 and again represent particle intensities for locations 21 of the region 31. However, the particle intensities represented by the data entries 113 of the data set 111 exhibit a dynamic range which is greater than the dynamic range of the particle intensities represented by the data entries 103 of the data sets 101, 105 and 107, respectively. Since the data sets 101, 105, 107, and 111 each represent image data for a representation of the region 31, the data set 111 represents an image having a dynamic range which is greater than the dynamic range of each of the images represented by the data sets 101, 105, and 107.

The data set 111 may again be stored in the storage 55.

A software or hardware module 119 computes the image data provided for representation at the output medium 59 from the data set 111. A rectangle 121 represents a first image data set for representation at the output medium 59. The image data set 121 includes entries 123 which correspond to pixels of the output medium 59. Further, a number of the entries 123 of the data set 121 is equal to the number of the entries 113 of the data set 111 so that the entire data set 111 is converted into image data 121. The entries 123 each represent a brightness at the output medium and are computed from the data entries 113 of the data set 111 according to a tone-mapping method to allow a good perceptibility of details in the represented image. The number of the entries 123 may be equal to the number of the pixels used for representation of the image data set 121 at the output medium 59. The number of the pixels may however also be greater or smaller than the number of the entries 123.

A rectangle 125 represents an image data set 125 for representation of a sub-region of the region 31 as an image on the output medium 59. Entries 123 of the image data set 125 are acquired merely from a subset of the data entries 113 of the data set 111, wherein the tone-mapping method illustrated above is again employed by the module 119. However, the contents of the entries 123 of the data set 125 are different from the corresponding entries 123 of the image data set 121, since the tone-mapping method is applied to a smaller image region of the image data set 125. This can achieve other results for individual image points as compared to a situation where the tone-mapping method is applied to the entire image region, since, for example, maximum and minimum particle intensities which are represented in the data set 125 may be different from maximum and minimum particle intensities which are represented by the data set 121.

Similarly, the rectangle 127 represents a further data set which is provided for representation of a detail of the region 31 on the output medium 59 and which is different from the sub-region of the data set 125. Entries 123 of the data set 127 are again calculated by the module 119 by using the tone-mapping method, wherein the contents of the entries 123 of the data set 127 may be different from the contents of the entries 123 of the data set 125 as well as of the corresponding entries 123 of the data set 121, since the entries 123 may contain maxima and minima of represented secondary electron intensities which are different from those of the data sets 125 and 121.

It is possible with the above illustrated method to obtain an improved visibility of structures contained in the represented sub-regions when only portions of the entire data set are represented on the output medium.

In the embodiment illustrated with reference to FIG. 2, the data set 111 is computed from the plural acquired data sets 101, 105, and 107 by the module 109, and the module 119 then computes image data sets 121 from the data set 111. However, it is also possible to compute an image data set directly from the data sets 101, 105, and 107 without computing or storing an intermediate data set 111.

In the embodiment illustrated with reference to FIG. 2, the data set 111 having the increased dynamic range has a same number of data entries as the data sets 101, 105, and 107 having the lower dynamic range. However, it is also possible that the data set 111 computed in the software or hardware module 119 have an increased or decreased number of data entries as compared to the data sets supplied to the module 119.

Further, it is possible that the data sets 101, 105, and 107 which represent particle intensities are further processed by other image processing methods before their processing by the module 109 to a data set having high dynamic range. Examples for such other image processing methods are methods for contrast enhancement, methods for smoothing of contrasts and also autocorrelation methods to compensate, for example, a shift of the sample between successive recordings.

Figure 3:
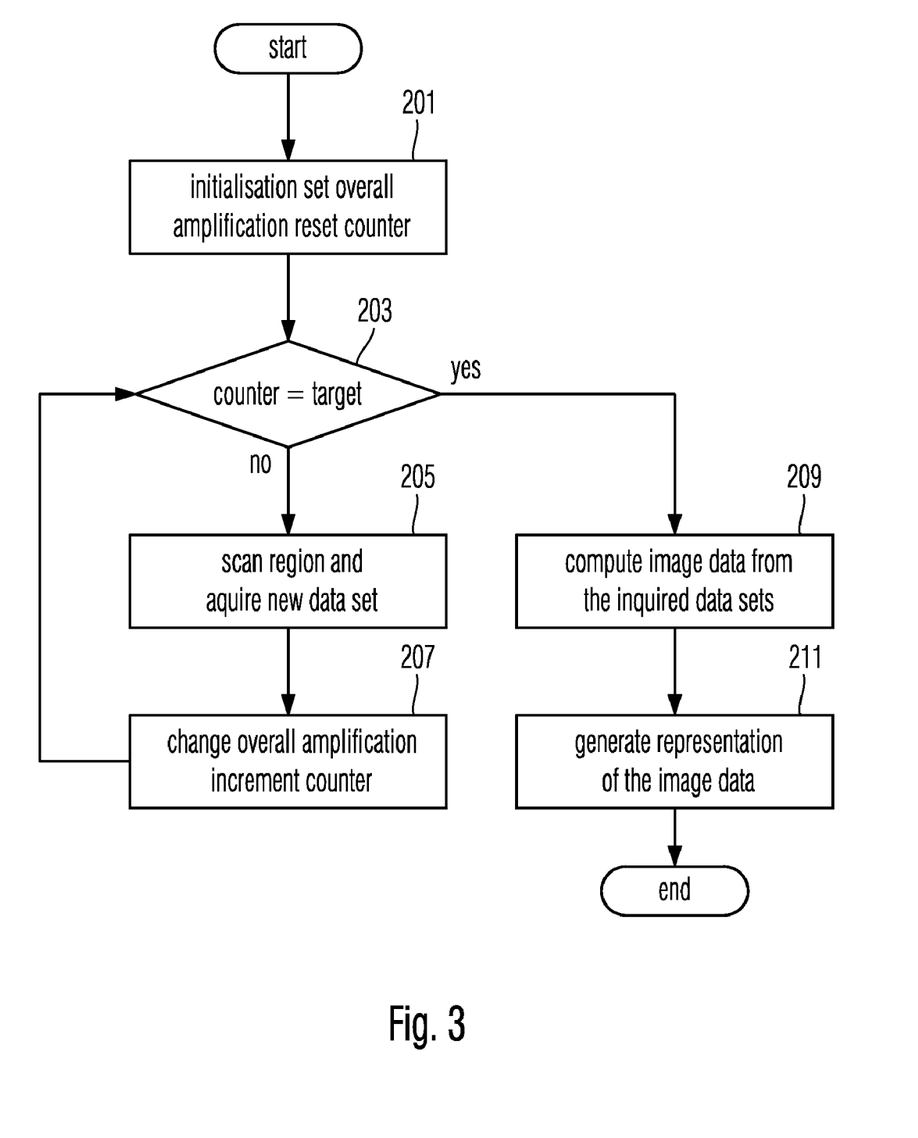
FIG. 3 is a flow diagram illustrating a method of generating a representation of a particle beam image.

FIG. 3 is a flow diagram for illustrating an embodiment of a method of generating a representation of a particle beam image. In a step 201, a particle beam apparatus and its controller is initialised by setting an overall amplification of a secondary particle detection system of the particle beam apparatus to a first value and by resetting a counter. In a step 203, a decision is made whether the content of the counter corresponds to a target value which will not be the case at the beginning of the method so that a step 205 is performed in which a region of an object is scanned using the particle beam apparatus and in which detected secondary particle intensities are represented in a data set. This data set can be stored in a storage medium. Then, in a step 207, the counter is incremented and an overall amplification of the secondary particle detection system is changed to a second value. In the step 203 it is then checked, whether the value of the counter incremented in the step 207 corresponds to the target value. If this is not the case, the region is again scanned in the step 205 and a new data set is acquired with the overall amplification changed in the step 207.

If the value of the counter in the step 203 is equal to the target value, image data are computed from the plural data sets in a step 209. The image data may be computed according to a tone-mapping method. After the computation of the image data a representation of the image data is generated at an output medium in a step 211.

This representation exhibits a high quality, since the computed image data due to the plural acquired data sets are based on a large amount of information about the scanned region and further, when the tone-mapping method is employed, since details and differences of the secondary particle intensities represented by the data sets are well perceivable in the represented image by the eye of the observer.

A target value for the counter which value is asked for in the step 203 may amount to 2, 3, 4, or 5 or higher. In the step 205, the new data set is acquired by scanning the region of the object with a focussed primary beam. However, it is also possible to illuminate the region with an extended primary beam and to image secondary particles generated by the extended primary beam in the region to a position sensitive detector including a plurality of detector elements or pixels producing detection signals which are represented by the new data set. A representation of a particle beam image can be generated by acquiring plural data sets using a particle beam apparatus, where each data set represents secondary particle intensities from a region of an object, and the secondary particle intensities for the different data sets are acquired at different parameter settings of the particle beam apparatus. From the plural acquired data sets image data are generated using a tone-mapping method, where the image data are represented at an output medium.

While certain exemplary embodiments are disclosed herein, alternatives, modifications and variations will be apparent to those skilled in the art. Accordingly, the exemplary embodiments set forth herein are intended to be illustrative and not limiting in any way. Various changes may be made without departing from the spirit and scope of the present disclosure.

What is claimed is:

1. A method, comprising:
    acquiring a first data set of intensity signals generated in a region of an object due to an interaction of a particle beam with the region of the object, the first data set being acquired at a first value of an overall amplification of a particle detection system, and the first data set representing an image having a dynamic range;
    acquiring a second data set of intensity signals generated in the region of the object due to an interaction of the particle beam with the region of the object, the second data set being acquired at a second value of an overall amplification of the particle detection system, the second value being different form the first value, and the second data set representing an image having a dynamic range;
    acquiring a third data set of intensity signals generated in the region of the object due to an interaction of the particle beam with the region of the object, the third data set being acquired at a third value of an overall amplification of the particle detection system, the third value being different form the first value and the second value, and the third data set representing an image having a dynamic range; and
    generating an image representation of at least a portion of the region of the object based on the first, second and third data sets, the image representation having a dynamic range,
    wherein:
    the dynamic range of the image representation is greater than the dynamic range of the image represented by the first data set,
    the dynamic range of the image representation is greater than the dynamic range of the image represented by the second data set,
    the dynamic range of the image representation is greater than the dynamic range of the image represented by the third data set, and
    the first, second and third data sets are consecutively generated in the region of the object.

2. The method according to claim 1, wherein the particle detection system comprises an electrical analogue amplifier, and setting an overall amplification of the particle detection system comprises setting an amplification of the electrical analogue amplifier.

3. The method according to claim 1, wherein the particle detection system comprises an electrical analogue-to-digital converter, and setting of an overall amplification of the particle detection system comprises setting a gain of the electrical analogue-to-digital converter.

4. The method according to claim 1, wherein the particle detection system comprises a photo multiplier, and setting an overall amplification of the particle detection system comprises setting acceleration voltages applied at dynodes of the photo multiplier.

5. The method according to claim 1, wherein generating an image representation is performed such that for each of group of three locations in the region of the object of a plurality of groups of three locations in the region of the object the following conditions are satisfied:
    an average is associated with each of the locations, an average being calculated based on the intensity signal corresponding to the location in the first data set and on the intensity signal corresponding to this location in the second data set;
    a first location of the group of three locations is spaced apart from a second location of the group of three locations by a first distance;
    a third location of the group of three locations is spaced apart from the first location of the group of three locations by a second distance that is at least three times greater than the first distance;
    the average associated with the first location is greater than the average associated with the second location;
    the average associated with the first location is greater than the average associated with the third location;
    the first location is represented in the image representation with a greater intensity than the second location; and
    the first location is represented in the image representation with a smaller intensity than the third location.

6. The method according to claim 5, wherein the conditions are satisfied for more than 50 different groups of three locations.

7. The method according to claim 5, wherein the locations of the groups of three locations correspond to different pixels of the image representation.

8. The method according to claim 1, wherein a parameter ratio is greater than 5, and the parameter ratio is a ratio of the first value to the second value, or a ratio of the second value to the first value.

9. The method according to claim 8, wherein the ratio is greater than 20.

10. The method according to claim 1, wherein more than two data sets are acquired for the region of the object using different settings of the overall amplification, and the image representation is generated based on the more than two data sets.

11. The method according to claim 1, wherein $0.50<V1<2.00$, and V1 represents a ratio between a beam current of the particle beam for acquiring the first data set and a beam current of the particle beam for acquiring the second data set.

12. The method according to claim 11, wherein $0.80<V1<1.20$.

13. The method according to claim 1, wherein acquiring a data set in the region of the object comprises scanning the particle beam across the region.

14. The method according to claim 13, wherein $0.50<V2<2.00$, and V2 represents a ratio between a scan velocity of the particle beam when acquiring the first data set and a scan velocity of the particle beam when acquiring the second data set.

15. The method according to claim 14, wherein $0.80<V2<1.20$.

16. The method according to claim 1, wherein the particles are electrons.

17. The method according to claim 1, wherein the particle beam is generated by a particle beam apparatus that comprises a particle beam source to generate the particle beam, and optics to direct the particle beam toward the object.

18. The method according to claim 17, wherein the particle beam source is an electron beam source.

19. The method according to claim 17, wherein the particle beam apparatus comprises the particle detection system.

20. A method, comprising:

acquiring a first data set of intensity signals generated in a region of an object due to an interaction between an electron beam and the object, the first set of data being acquired at a first value of an overall amplification of a particle detection system, and the first set of data representing an image having a dynamic range;

acquiring a second data set of intensity signals generated in the region of the object due to an interaction of the electron beam and the object, the second set of data being acquired at a second value of an overall amplification of the particle detection system, the second value being different form the first value, and the second set of data representing an image having a dynamic range;

acquiring a third data set of intensity signals generated in the region of the object due to an interaction of the electron beam and the object, the third set of data being acquired at a third value of an overall amplification of the particle detection system, the third value being different form the first value and the second value, and the third set of data representing an image having a dynamic range; and generating an image representation of at least a portion of the region of the object based on the first, second and third data sets, wherein:

the dynamic range of the image representation is greater than the dynamic range of the image represented by the first data set, the dynamic range of the image representation is greater than the dynamic range of the image represented by the second data set, the dynamic range of the image representation is greater than the dynamic range of the image represented by the third data set, and the first, second and third data sets are consecutively generated in the region of the object.

* * * * *

UNITED STATES PATENT AND TRADEMARK OFFICE
CERTIFICATE OF CORRECTION

PATENT NO. : 8,153,967 B2  
APPLICATION NO. : 12/542213  
DATED : April 10, 2012  
INVENTOR(S) : Christian Hendrich Page 1 of 1

It is certified that error appears in the above-identified patent and that said Letters Patent is hereby corrected as shown below:

Title Page, Col. 2, Item (56)  
(Other Publications), Delete "Software-Modul" and insert --Software-Module--

Column 1,  
Line 10, delete "2009." and insert --2008.--

Column 9,  
Line 33, delete "form" and insert --from--

Column 9,  
Line 41, delete "form" and insert --from--

Column 11,  
Line 23, delete "form" and insert --from--

Column 12,  
Line 6, delete "form" and insert --from--

Signed and Sealed this  
Twenty-ninth Day of May, 2012

David J. Kappos  
*Director of the United States Patent and Trademark Office*